(12) United States Patent
Tesson et al.

(10) Patent No.: US 9,721,844 B2
(45) Date of Patent: Aug. 1, 2017

(54) SEMICONDUCTOR DEVICE COMPRISING A SWITCH

(71) Applicant: NXP B.V., Eindhoven (NL)

(72) Inventors: Olivier Tesson, Caen (FR); Hamza Nijjari, Caen (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/013,648

(22) Filed: Feb. 2, 2016

(65) Prior Publication Data

US 2016/0247880 A1    Aug. 25, 2016

(30) Foreign Application Priority Data

Feb. 25, 2015    (EP) .................................... 15290041

(51) Int. Cl.

| | |
|---|---|
| *H01L 27/088* | (2006.01) |
| *H01L 21/8234* | (2006.01) |
| *H01L 29/78* | (2006.01) |
| *H01L 29/417* | (2006.01) |
| *H01L 29/66* | (2006.01) |
| *H01L 29/423* | (2006.01) |
| *H01L 21/762* | (2006.01) |
| *H01L 23/482* | (2006.01) |

(52) U.S. Cl.
CPC ................ *H01L 21/823475* (2013.01); *H01L 21/76224* (2013.01); *H01L 23/4824* (2013.01); *H01L 29/41758* (2013.01); *H01L 29/4238* (2013.01); *H01L 29/66477* (2013.01); *H01L 29/78* (2013.01)

(58) Field of Classification Search
CPC ........... H01L 29/0696; H01L 29/66477; H01L 29/0649; H01L 29/41758; H01L 29/78; H01L 21/823418; H01L 21/823475
See application file for complete search history.

(56) References Cited

U.S. PATENT DOCUMENTS 6,713,823 B1    3/2004  Nickel
2004/0206983 A1  10/2004  Yi et al.
(Continued)

FOREIGN PATENT DOCUMENTS

EP    1 471 581 A2    10/2004
JP    03278579    12/1991

OTHER PUBLICATIONS

Extended European Search Report for Application No. 15290041.1 (Aug. 4, 2015).

(Continued)

*Primary Examiner* — Dale E Page
*Assistant Examiner* — Wasiul Haider

(57) ABSTRACT

A semiconductor device comprising a switch and a method of making the same. The device has a layout that includes one or more rectangular unit cells. Each unit cell includes a gate that divides the unit cell into four corner regions. Each unit cell also includes a source comprising first and second source regions located in respective opposite corner regions of the unit cell. Each unit cell further includes a drain comprising first and second drain regions located in respective opposite corner regions of the unit cell. Each unit cell also includes a plurality of connection members extending over the gate, source and drain for providing electrical connections to the gate, source and drain.

13 Claims, 10 Drawing Sheets

(56) References Cited

U.S. PATENT DOCUMENTS

| | | | |
|---|---|---|---|
| 2008/0157195 A1 | 7/2008 | Sutardja et al. | |
| 2009/0085215 A1* | 4/2009 | Stecher | H01L 24/05 257/762 |
| 2010/0096667 A1* | 4/2010 | Nakajima | H01L 27/0207 257/194 |
| 2011/0133310 A1* | 6/2011 | Anderson | H01L 21/76224 257/532 |
| 2012/0306022 A1* | 12/2012 | Chuan | H01L 27/0207 257/390 |
| 2013/0087828 A1 | 4/2013 | Koshimizu et al. | |

OTHER PUBLICATIONS

Ohnakado, Takahiro et al; "A 0.8-dB Insertion-Loss, 17.4-dBm Power-Handling, 5-GHz Transmit/Receive Switch With DETs in a 0.18-μm CMOS Process"; IEEE Electron Device Letters, vol. 24, No. 3; pp. 192-194 (Mar. 2003).

Saha, Prabir K. et al; "A K-band nMOS SPDT Switch and Phase Shifter Implemented in 130nm SiGe BiCMOS Technology"; IEEE Topical Meeting on Silicon Monolithic Integrated Circuits in RF Systems; San Diego, CA, US; 4 pages (Jan. 19-21, 2009).

Thrivikraman, Tushar K. et al; "The Impact of Technology Node Scaling on nMOS SPDT RF Switches"; Proceedings of the 3rd European Microwave Integrated Circuits Conference; Amsterdam, The Netherlands; 4 pages (Oct. 2008).

Yoo, Abraham et al; "High Performance Low-Voltage Power MOSFETs with Hybrid Waffle Layout Structure in a 0/25 μm Standard CMOS Process"; Proceedings of the 20th International Symposium on Power Semiconductor Devices & IC's, Orlando, FL, US; 4 pages (May 18-22, 2008).

\* cited by examiner

SEMICONDUCTOR DEVICE COMPRISING A SWITCH

CROSS-REFERENCE TO RELATED APPLICATIONS

This application claims the priority under 35 U.S.C. §119 of European patent application no. 15290041.1, Feb. 25, 2015 filed the contents of which are incorporated by reference herein.

FIELD OF THE INVENTION

This invention relates to a semiconductor device comprising a switch.

BACKGROUND OF THE INVENTION

Known RF (Radio Frequency) MOS (Metal-Oxide-Semiconductor) switches are based on a comb type layout. In this layout, the switch includes a gate that has a plurality of interconnected fingers. The fingers are interspersed with source and drain regions comprising elongate strips. Metal interconnects are provided to each source and drain region through a series of vias located at several points along each strip. Generally, the connection to the gate as made at one side of the device, at a common strip that interconnects each finger of the comb. The device may be surrounded by deep trench isolation (DTI).

Losses within such a switch may be relatively high. For instance, the isolation provided by the DTI surrounding the device does not affect substrate impedance within the device. Also, connection to the source and drain regions is relatively difficult, and can require connections having relatively high electrical resistance to be used.

Scaling of such a device is also limited to adding additional fingers to the comb or by varying the length of the fingers.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a semiconductor device including a switch. The device has a layout that includes one or more rectangular unit cells. Each unit cell includes a gate that divides the unit cell into four corner regions. Each unit cell also includes a source comprising first and second source regions located in respective opposite corner regions of the unit cell. Each unit cell further includes a drain comprising first and second drain regions located in respective opposite corner regions of the unit cell. Each unit cell also includes a plurality of connection members extending over the gate, source and drain for providing electrical connections to the gate, source and drain.

According to another aspect of the invention, there is provided a method of making a semiconductor device including a switch. The method includes forming at least one rectangular unit cell of the switch by: providing a semiconductor substrate; forming a gate on the substrate for dividing the unit cell into four corner regions; forming a source comprising first and second source regions located in respective opposite corner regions of the unit cell; forming a drain comprising first and second drain regions located in respective opposite corner regions of the unit cell, and forming a plurality of connection members extending over the gate, source and drain for providing electrical connections to the gate, source and drain.

The provision of a device having a layout that includes one or more rectangular unit cells can allow the device conveniently to be scaled by adding further unit cells to the layout. The unit cell includes features which may allow it to interface with any neighbouring unit cells of the device, to simplify this scaling. These features include a gate that divides the unit cell into four corner regions, and a source and drain that include regions that are located in respective opposite corner regions. Electrical connections to the gate, source and drain are provided by connection members that extend over the gate, source and drain.

In some embodiments, each unit cell may further include trench isolation. For example, the trench isolation may be deep trench isolation (DTI). The trench isolation can increase the impedance of the substrate, for improving the performance of the switch. The location of the trench isolation within the unit cell (as opposed to isolation that simply surrounds the overall device) can improve the impedance of the substrate compared to devices having the comb type layout as described above. The trench isolation may include a respective trench section located in each corner region of the unit cell. The trench isolation may be located at a periphery of each unit cell. The trench isolation and may completely enclose a central region of each unit tell when viewed from above a surface on which the unit cell is located. The central region may include the source and drain regions.

In one embodiment, each unit cell may include a source connection member that extends diagonally across the unit cell to connect to the first and second source regions. As noted above, the first and second source regions are located in respective opposite corner regions of the unit cell and the corner regions of the unit cell are divided from each other by the gate. In this layout, the provision of a diagonally extending source connection member over the source can allow the first and second source regions to be connected together and/or allow connections external to the unit cell to be made. Similarly, a drain connection member may be provided that extends diagonally across the unit cell to connect to the first and second drain regions. In some embodiments, the source connection member and the drain connection member may cross each other at a center of the unit cell when viewed from above a surface on which the unit cell is located. The relatively small overlap achieved by the provision of source and drain connection members that cross in this way can reduce capacitive coupling between them.

In one embodiment, the gate is cross-shaped, when viewed from above a surface on which the unit cell is located. This kind of gate can conveniently divide the unit cell into corner regions as noted above. To increase the gate length for a given unit cell size, in some embodiments, the gate may include four arms, each arm including a meander pattern when viewed from above the surface on which the unit cell is located.

In one embodiment, the connection members may be formed in a metallisation stack that is located above the gate, source and drain. In the metallisation stack, a metallisation layer containing a source connection member may be separated from a metallisation layer containing a drain connection member by at least one intervening metallisation layer in the metallisation stack. The separation of the layers including the source and drain connection members in this way can reduce capacitive coupling between them. The intervening metallisation layer may in some examples include a gate connection member.

The device may include a plurality of unit cells arranged in an array. For instance, the array may comprise a square or rectangular array.

The plurality of connection members of each unit cell may connect to connection members of neighbouring unit cells at the edges of the unit cells when viewed from above a surface on which the unit cell is located. Source connection members and/or drain connection members of each unit cell may connect with source connection members and/or drain connection members of neighbouring unit cells at the corners of the unit cells.

In some embodiments, nearest neighbour unit cells of the array may be rotated with respect to each other by ninety degrees when viewed from above a surface on which the unit cell is located. For instance, this may allow correct connection of source and/or drain members that extend diagonally across each unit cell to be made, for instance at the corners of the unit cells as noted above.

In accordance with an embodiment of this invention, each unit cell may be square. It is envisaged that some embodiments may include oblong unit cells.

In one embodiment, the device is an RF MOS switch.

According to a further aspect of the invention, there is provided a Radio Frequency (RF) circuit comprising a semiconductor device of the kind described above.

For the purposes of this application, radio frequency (RF) signals may be considered to be signals in the frequency range $1 \text{ GHz} \leq f \leq 40 \text{ GHz}$. For instance, the signals may be in the bands used for WLAN communications (e.g. 2.4-2.5 GHz & 4.9-5.92 GHz). In other examples, the RF signals may be in one of the following IEEE bands: L band=1-2 GHz, S band=2-4 GHz, C band=4-8 GHz, X band=8-12 GHz, $K_u$ band=12-18 GHz, K band=18-27 GHz, $K_a$ band=26.5-40 GHz.

Embodiments of this invention may, for instance, be used in LTE/WLAN integrated circuits (ICs), such as those incorporating low noise amplifiers and a switch, and front end integrated circuits ICs.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention can provide a semiconductor device that includes a switch. The device has a layout that comprises one or more unit cells. The unit cells are generally rectangular (a quadrilateral having four right angled corners) and may, for example, be square or oblong. As will be described in more detail below, the provision of unit cells having a rectangular shape according to an embodiment of this invention can allow the device to be scaled by adding additional unit cells. In some embodiments, the unit cells may be provided in an array such as a rectangular, oblong or square array, according to the shape of the unit cells used. The unit cells may generally have a shape that allows them to tessellate within the array, whereby connection members provided in the unit cells can conveniently interconnect at the edges of the unit cells with the connection members of neighbouring unit cells.

Each unit cell includes a number of features. For instance, each unit cell has a gate that divides the unit cell into four corner regions. The gate may be cross-shaped. A cross-shaped gate can include arms that may run substantially parallel to the edges of the unit cell. The unit cell can also include a source that has first and second source regions that are located in respective opposite corner regions of the unit cell, as defined by the gate. The unit cell can also include a drain that includes first and second drain regions located in respective opposite corner regions of the unit cell in much the same way as described above in relation to the source. The corner regions occupied by the source regions of the source are generally different corner regions to those occupied by the drain regions.

The various above-described features of the unit cell can be connected to using a plurality of connection members. These connection members may extend over the gate, source and drain to implement the connections. For instance, the connection members may be implemented in a metallisation stack located above the unit cell. The arrangements of the connection members in the examples described below may also be relatively compact, requiring fewer metal levels to implement than prior devices (for instance only three metal levels are used in the embodiment of FIGS. 1 and 2).

Figure 1:
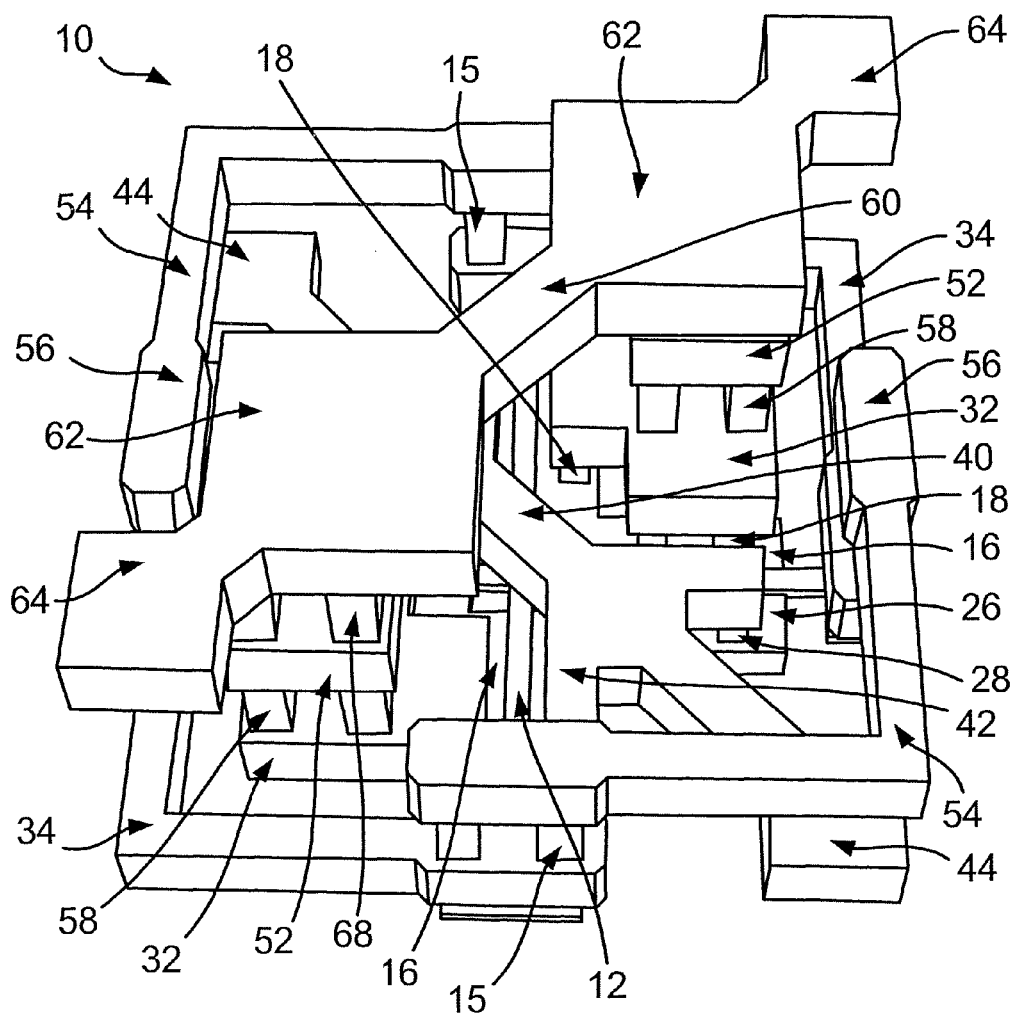
FIG. 1 shows a semiconductor device in accordance with an embodiment of the invention.

FIG. 1 shows a semiconductor device 10 according to a first embodiment of this invention. The view of the device 10 in FIG. 1 is three-dimensional, so as clearly to display the layered nature of the various connection members in this embodiment.

In FIG. 1, a single unit cell is shown. The unit cell includes a gate 12, which in this embodiment is cross-shaped. The unit cell also includes first and second source regions 26 which are located in respective opposite corner regions of the unit cell. The unit cell further includes first and second drain regions 26 which are provided in respective opposite corner regions of the unit cell.

The unit cell also includes a plurality of connection members. These connection members include a source connection member 60 that extends diagonally across the unit cell to connect to the first and second source regions 16 and a drain connection member 40 that extends diagonally across the unit cell to connect to the first and second drain regions 26. Note that in this embodiment, the source connection 60 extends in a direction that is substantially orthogonal to the direction in which the drain connection member 40 extends. The plurality of connection members further includes gate connection members 34 and 54. The gate connection member 34, 54 extend around a periphery of the unit cell.

Although FIG. 1 clearly displays the layout of the connection members in three dimensions, for further clarity, the various components of the unit cell of FIG. 1 will be described in more detail below in relation to FIGS. 2A-2D. In FIGS. 2A-2D, various layers and regions of the unit cell of the device 10 are shown separately.

Figure 2A:
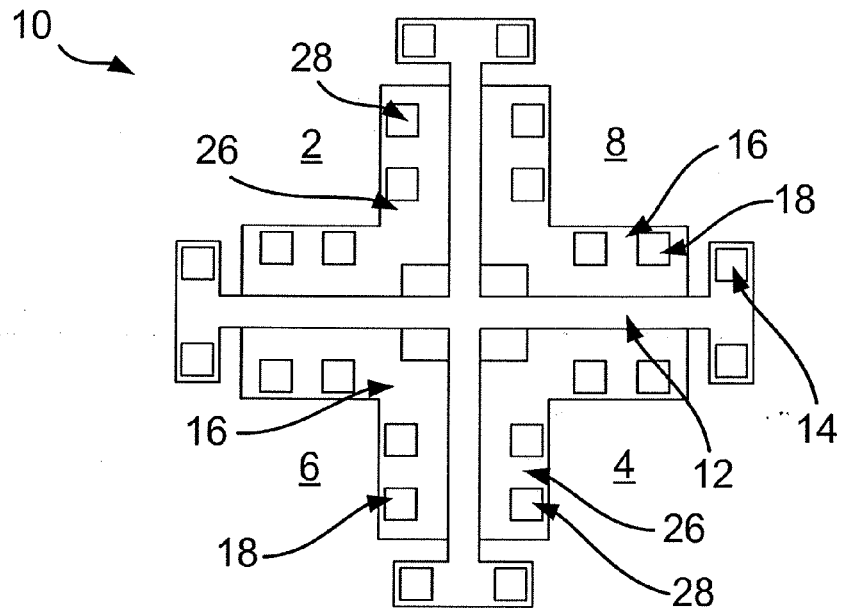
FIGS. 2A to 2E show the layout of a semiconductor device in accordance with an embodiment of the invention.

FIG. 2A shows a lower region of the unit cell which may be formed on a major surface of a semiconductor substrate (for instance, a silicon substrate). The lower region of the unit cell of the device 10 in this embodiment includes the gate 12. As can be seen from FIG. 2A, the gate 12 in this embodiment is substantially cross-shaped. The cross formed by the gate has four arms. The gate 12 may comprise polysilicon deposited on the major surface of the semiconductor substrate in a manner that is known in the art.

The cross-shaped layout of the gate 12 in this embodiment divides the unit cell into four corner regions 2, 4, 6, 8. In this embodiment, each corner region includes either a source region 16 of the source or a drain region 26 of the drain. Accordingly, the source regions 16 of the source are located in respective opposite corner regions 6, 8 of the unit cell, while each drain regions 26 of the drain is located also in respective opposite corner regions 2, 4 of the unit cell. The arms of the gate 12 thus separate the source and drain regions 16, 18 of the unit cell from each other. The source and drain regions 16, 26 may comprise doped regions located in the semiconductor substrate.

In this embodiment, each source region 16 includes a number of source contacts 18, while each drain region 26 includes a number of drain contacts 28. As noted above, the gate 12 includes a number of gate contacts 14. The contacts 14 of the gate 12 may be provided at an end of each arm of the cross-shaped layout of the gate 12. As can be seen in FIG. 2A, the end of each arm of the cross-shaped gate may be provided with a contact region in which one or more contacts 14 of the gate 12 may be situated. The contact region may extend substantially parallel to the edges of the unit cell. As will be described in more detail below, connections may be made to the contacts 14, 18, 28 of the gate 12, source regions 16, and drain regions 26 using connection members that extend over the gate source and drain of the unit cell.

In some embodiments, the connection members can be implemented in a metallisation stack that is located above the surface of a semiconductor substrate incorporating the gate 12, source regions 16 and drain regions 16. Metallisation stacks are commonly used in the manufacture of semiconductor device to provide interconnections. The maturity of metallisation technologies can allow precise optimisation of the layout of the interconnections according to the configuration of the underlying device features. A metallisation stack typically includes a plurality of layers including patterned metal features. Within each metal level, the patterned metal features are typically surrounded by dielectric. Metallisation stacks typically also include layers of dielectric that are located in-between the various metal levels to electrically isolate them from each other. Vias containing metal can be provided within the dielectric layers to provide electrical connections between the metal levels as required. In the metallisation stack, the metal used for the metal layers can, for instance, comprise Cu or Al. The interconnecting vias between the metal levels can, for instance, comprise Cu, Al, Ti, or W.

Figure 2B:
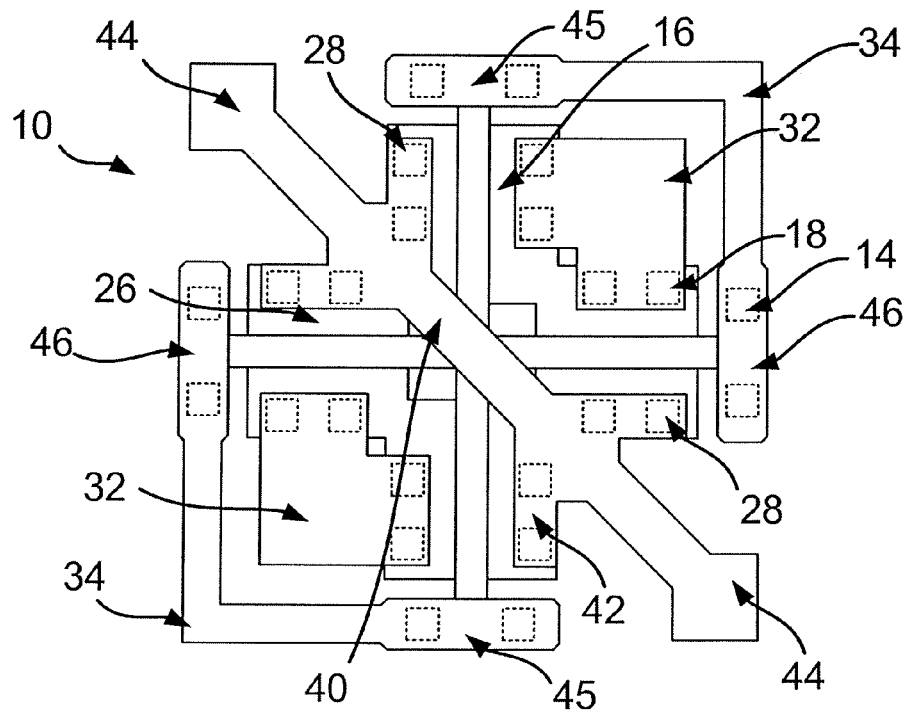

FIG. 2B shows the layout of a first metal level of a metallisation stack located above the unit cell in this embodiment. In this embodiment, the first metal level includes a drain connection member 40. The drain connection member 40 may be elongate. The drain connection member 40 can extend diagonally across the unit cell to connect to the first and second drain regions 26. In FIG. 2B, the underlying contacts 28 to the first and second drain regions 26 are shown using dotted lines. Electrical connections between the underlying contacts 28 and the drain connection member 40 may be implemented using metal filled vias as noted above.

In this embodiment, the drain connection member 40 includes protrusions 42 that protrude outwardly from the sides of the drain connection member 40 to extend over the contacts 28 of the drain regions 26. This can allow the drain connection member 40 to be connected to the various contacts 28 of the drain regions 26 the using metal vias as noted previously. The drain connection member 40 in this embodiment also includes edge connecting portions 44. The edge connecting portions 44 are located at the corners of the unit cell corresponding to the corner regions 2, 4 of the unit cell in which the drain regions 26 are provided. The edge connecting portions 44 of the drain connection member 40 can allow the drain connection member 40 of the unit cell to be connected to the drain connection members of neighbouring unit cells, as will be described in more detail below.

In this embodiment, the first metal level includes a number of further patterned metal features. In particular, the first metal level in this embodiment includes a pair of gate connection members 34. The gate connection members 34 may be substantially L-shaped and may extend around the periphery of the unit cell, as shown in FIG. 2B. Each gate connection member 34 has a first end 45 and a second end 46, which may each connect to gate contacts 14 located at the end of a respective arm of the gate 12. The gate connection members 34 can connect together the gate contacts 14 located at the ends of each of two pairs of neighbouring arms of the gate 12. The underlying gate contacts 14 located beneath the gate connection members 34 are shown using dotted lines. Electrical connection between the gate connection members 34 and the underlying contacts 14 can be implemented using metal filled vias.

In this embodiment, the first metal level of the metallisation stack can further include platforms 32 that can connect together the various contacts 18 of the source regions 16 of the unit cell. These platforms 32 can be used as intermediate stages for implementing the connection of the source regions 16 to the source connection member described below.

Figure 2C:
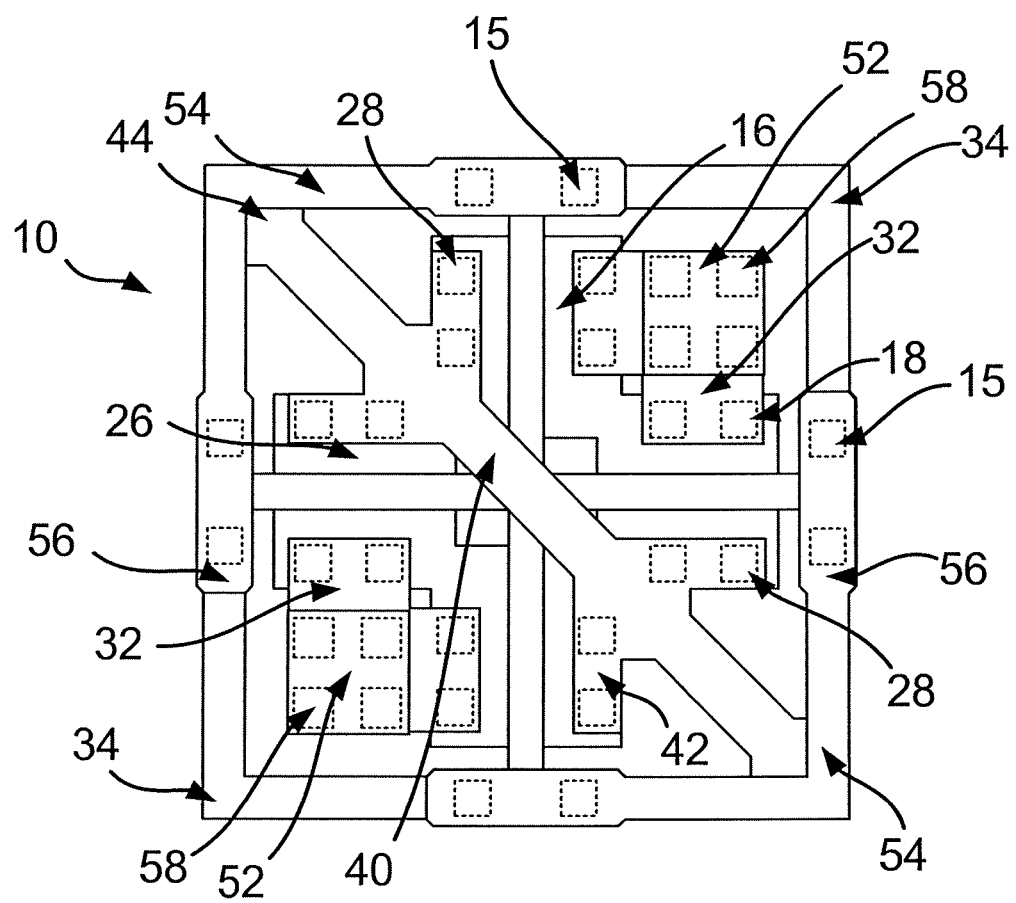

FIG. 2C shows the layout of a next metal level of the metallisation stack above the unit cell of the device 10 in this embodiment. In this second metal level, the device 10 can include further gate connection members 54. The further gate connection members 54 may be configured similarly to the gate connection members 34 described above in relation to FIG. 2B. The further gate connection members 54 can interconnect the ends of the gate connection members 34 in the underlying metal level as shown in FIG. 2C. The connections between the gate connection members 34 and the further gate connection members 54 may be implemented using metal filled vias 15, which are shown in FIG. 2C using dotted lines. In this way, all of the gate contacts 14 of the gate 12 can be electrically connected together.

As can be seen in FIGS. 2B and 2C, the corners of the L-shaped connection members 34 and further gate connection members 54 can coincide with the corners of the unit cell of the device 10.

In this embodiment, the second metal level can further include platforms 52 that can connect to the underlying platforms 32 described above in relation to FIG. 2B using metal filled vias 58. The vias 58 are shown using dotted lines in FIG. 2C. Note that the provision of the platforms 32 and platforms 52 can allow connections to be made between the source connection member (see below) and the source regions 16 of the unit cell in a manner that does not interfere with the provision of the drain connection member 40, the gate connection members 34 or the further gate connection members 54.

Figure 2D:
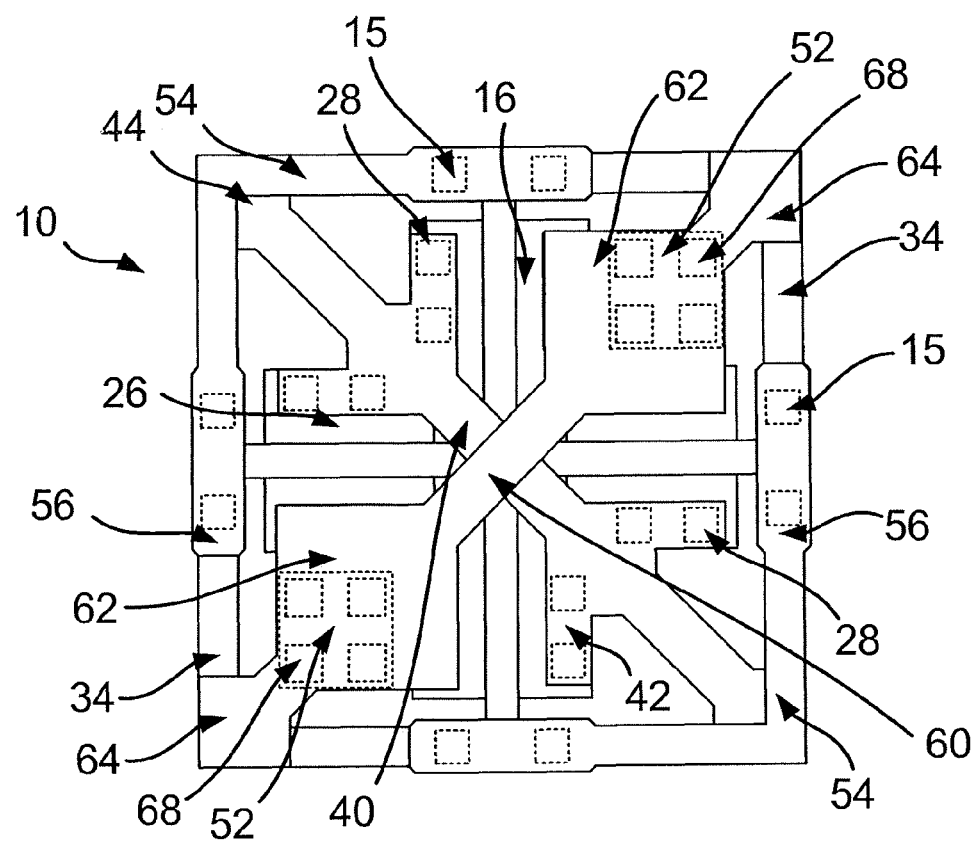

FIG. 2D shows the layout of a third metal level of a metallisation stack located above the unit cell of the device 10 in this embodiment. In this third metal level there is provided a source connection member 60. The source connection member 60 may be elongate. The source connection member 60 extends diagonally across the unit cell to connect to the first and second source regions 16. The connections to the source regions 16 are made via the platforms 32, 52 described above.

In this embodiment, the source connection member 60 and the drain connection member 40 extend between opposite corners of the unit cell. As the unit cell is square shaped in this embodiment, the source connection member 60 extends in a direction across the unit cell that is substantially orthogonal to the direction in which the drain connection member 40 extends.

As described above in relation to the drain connection member 40, the source connection member 60 can include edge connecting portions 64. In this embodiment, the edge connecting portions 64 are located at opposite corners of the unit cell corresponding to the corner regions 6, 8 of the unit cell in which the source regions 16 are located. The edge connecting portions 64 of the source connection member 60 can be used to connect the source connection member 60 to the source connection members of neighbouring unit cells in much the same way as described above in relation to the edge connecting portions 44 of the drain connection member 40. The edge connecting portions 44, 64 of the source and drain connection members 40, 60, as well as the configuration of the gate connection members 34, 54, may thus allow for convenient scaling of a switch according to an embodiment of this invention by simply adding further unit cells to an array of the device 10. Note that scaling of the device in way does not necessarily require any alterations to the layout of the connection members or other features of the unit cells used. An array of unit cells will be described in more detail below in relation to FIGS. 3 and 4.

As noted above, the source connection member 60 and the drain connection member 40 in this example extend across the unit cell in different directions. With reference to FIG. 2D, it can be seen that because the source connection member 60 and the drain connection member 40 are elongate and extend in substantially different directions across the unit cell, the area of overlap between the source connection member 60 and the drain connection member 40, when viewed from above the unit cell, is small. In the present embodiment, the area of overlap is located generally towards the centre of the unit cell, as a consequence of the fact that the source connection member 60 and drain connection member 40 extend between opposite corners of the unit cell. The minimal overlap between the source connection member 60 and the drain connection member 40 of the unit cell can reduce losses within a device 10, as capacitance between the source and the drain can be reduced, whereby degradation in $C_{off}$ capacitance can be avoided. Similarly, because the source connection member 60 and the drain connection member 40 are contained in metal levels within the metallisation stack that are not adjacent (e.g. in this embodiment they are separated from each other by the metal level described above in relation to FIG. 2C, which includes the gate connection members 34), the vertical distance between the source connection member 60 and the drain connection member 40 may be relatively large, again to reduce drain-source capacitance.

Another feature of the layout of the various connection members within the metallisation stack is that the gate connection members 34, the corners of which lay directly beneath the source connection member 60, are located in a lower metal level of the stack, while the source connection member 60 is located in an upper metal level of the stack. This arrangement can help to reduce capacitance between the source and the gate of the switch. Note that although the further gate connection members 54 of the unit cell are located in a metal level that is closer to the source connection member 60 than the metal level containing the gate connection members 34, no part of the further gate connection members 54 is located directly beneath the source connection member 60 in this embodiment, so that again source-gate capacitance is reduced.

In this embodiment, the source connection member 60 further includes connection portions 62 for connecting to the underlying features of the platforms 52 described above in relation to FIG. 2C. The platforms 52 are shown using the dotted lines in FIG. 2D. The shape of the connection portions 62 of the source connection member 60 can be chosen to allow vertical connection between the underlying platforms 52 using the metal vias 68 located in the intervening dielectric layer. These metal filled vias 68 are shown using dotted lines in FIG. 2D. Connections between the source connection member 60 and the first and second source regions of the unit cell may thereby be implemented.

Figure 2E:
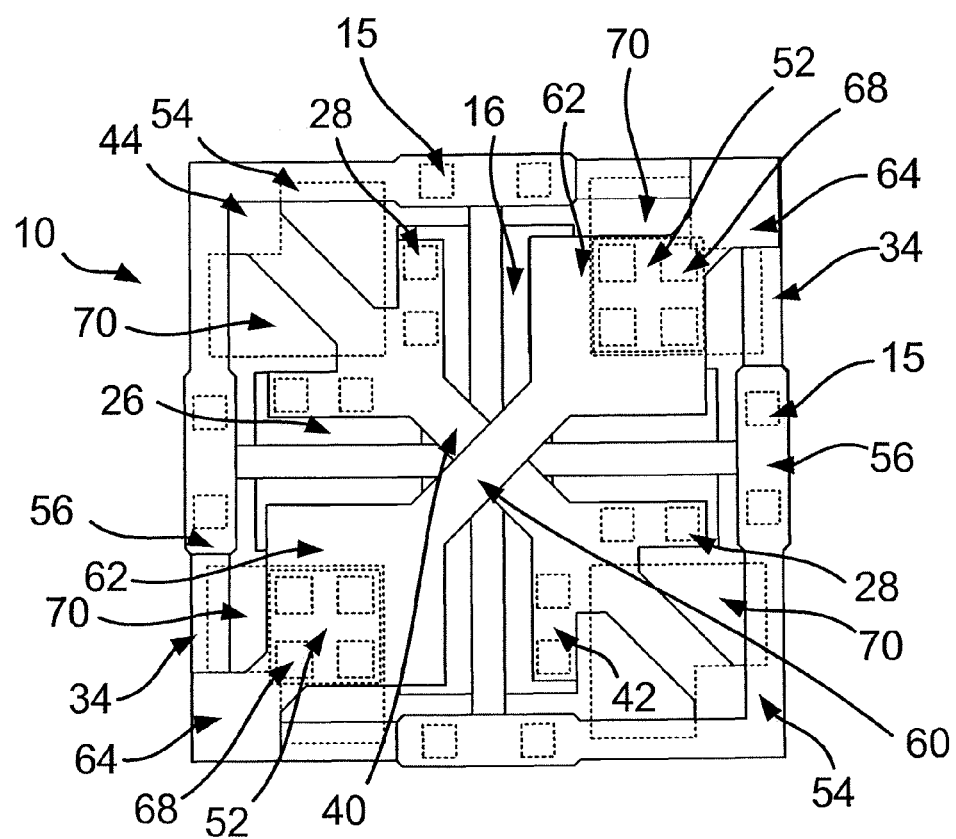

In some embodiments, each unit cell can further include trench isolation. The provision of the trench isolation can break up the substrate in order to increase the impedance of the substrate. This can improve switch isolation within the device 10, leading to fewer losses and a better noise figure (NF). FIG. 2E shows an example of the layout of such trench isolation in a unit cell of the kind described above in relation to FIGS. 1 and 2A-2D.

In this example, the trench isolation includes a separate trench section 70 in each corner region 2, 4, 6, 8 of the unit cell as shown by the dotted lines in FIG. 2E. The trench isolation may comprise a trench etched into the surface of the substrate and filled with a dielectric. For instance, the trench isolation may be deep trench isolation (DTI) as is known in the art. In the present example, each trench section 70 is substantially L-shaped with the corner of each "L" pointing inward towards the middle unit cell. The ends of the arms of the L-shaped trench sections terminate at the sides of the unit cell. As will be described below, this allows the trench sections 70 of each unit cell to join the trench sections of neighbouring unit cells in an array.

The substantially L-shaped trench sections 70 in this example are L-shaped so as to fill the parts of the corner regions 2, 4, 6, 8 that are not occupied by the first and second source regions 16 and the first and second drain regions 26. In other examples, it is envisaged that the trench sections 70 may take a different shape (for instance see FIG. 5, described below).

Figure 3:
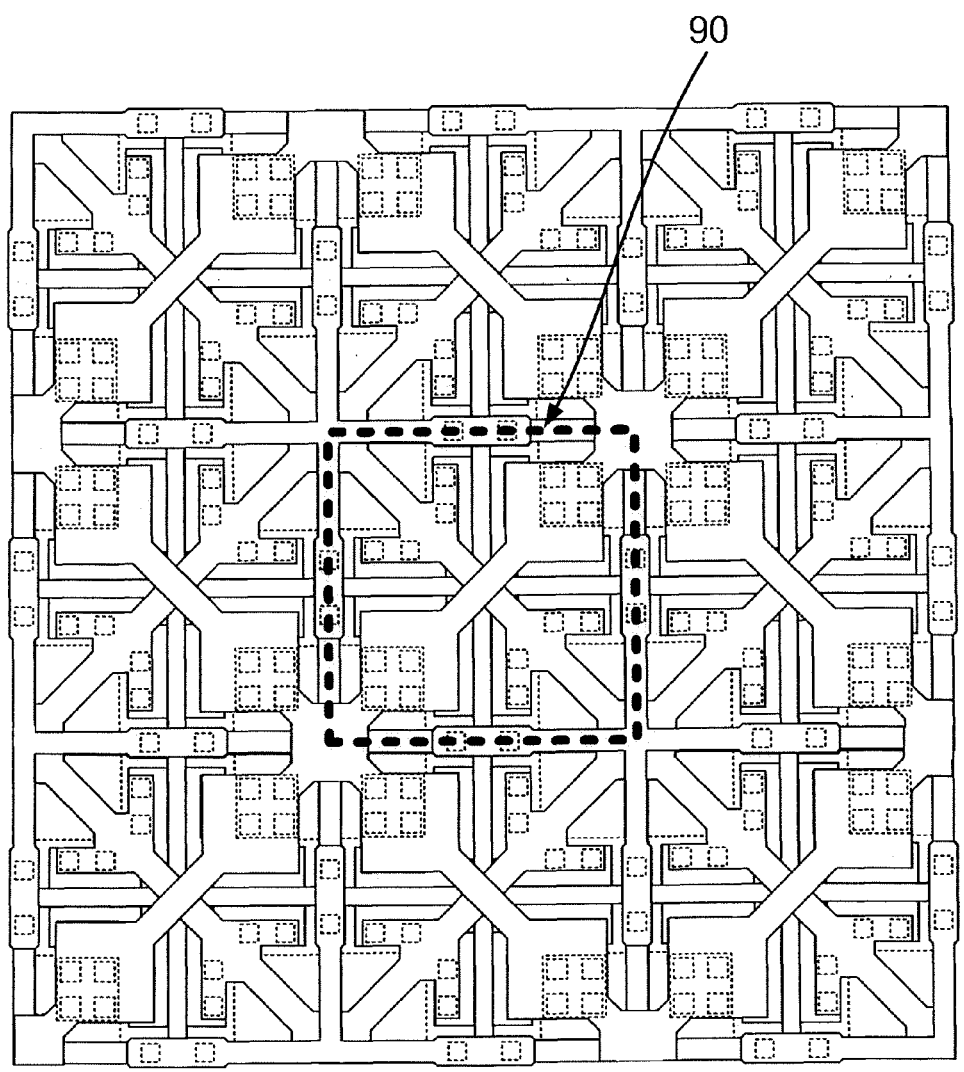
FIG. 3 shows a semiconductor device including a plurality of unit cells arranged in an array in accordance with an embodiment of the invention.

FIG. 3 shows a semiconductor device including comprising a plurality of unit cells 90 arranged in an array. In particular, in this example, the array includes nine unit cells of the kind described above in relation to FIG. 2E. The unit cell at the centre of the array is outlined by the dashed line 90. As can be seen from FIG. 3, the adjacent unit cells tessellate such that the source, drain and gate connection members of each unit cell connect together at the unit cell edges. As described above, this can provide for convenient scaling of a device including a switch according to an embodiment of this invention simply by adding further unit cells to the array.

In this example, adjacent (nearest neighbour) unit cells within the array are rotated by 90° with respect to each other in order to allow correct termination between the source, drain and gate connection members at the unit cell edges. For instance, in FIG. 3 the unit cell indicated by the prominent dashed line 90 has the same orientation as the unit cells at each corner of the array. The other four unit cells in the array are each rotated by 90° relative to the unit cell at the center of the array. Notwithstanding the rotation of nearest neighbour unit cells within the array, no internal change to the layout of the unit cells is necessary to permit scaling of the device by adding cells.

Figure 4:
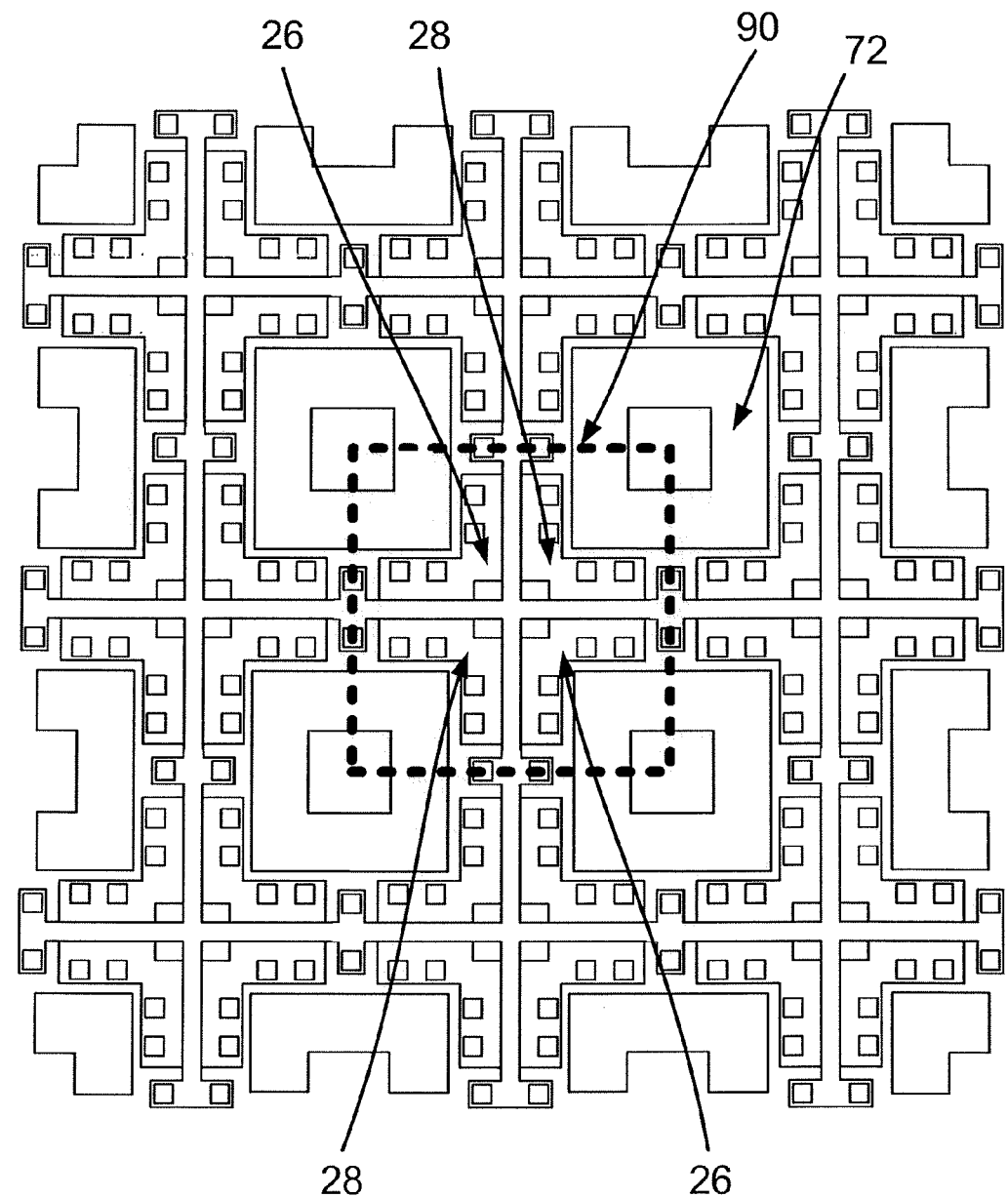
FIG. 4 shows the semiconductor device of FIG. 3 with certain parts removed, so as clearly to show the layout of trench isolation provided in the device.

In FIG. 4, the array of FIG. 3 is illustrated with all of the connection members of each unit cell removed so as to show the underlying features of the trench isolation, source regions 16, drain regions 26 and gate 12. From FIG. 4 it can be seen that the gate contacts 14 of the gate 12 of each unit cell may be shared (at the edges of the unit cells) with the gate contacts 14 of neighbouring unit cells. Also as described above, the trench sections 70 of each unit cell can abut each other to form ring-shaped trenches 72 in the array.

Figure 5:
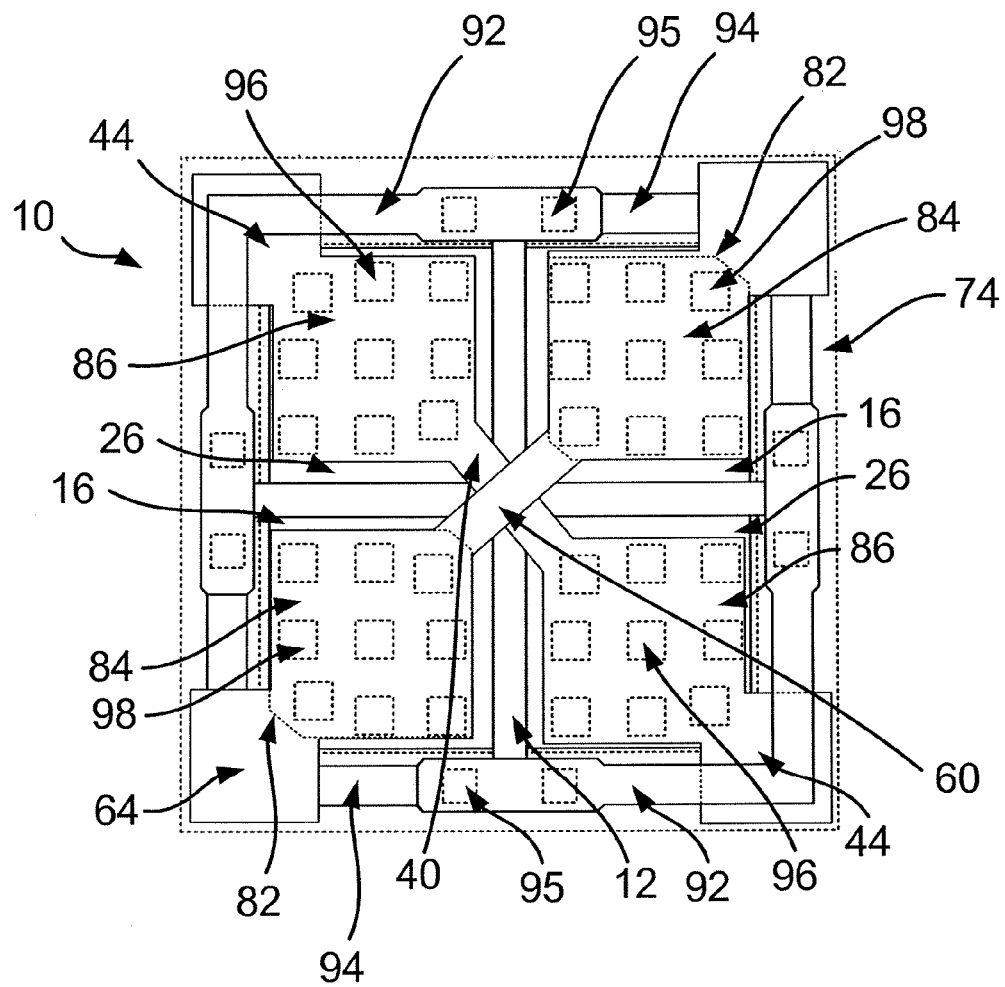
FIG. 5 shows a semiconductor device in accordance with an embodiment of the invention.

FIG. 5 shows a semiconductor device including a switch in accordance with another embodiment of this invention. In common with the embodiment described above, the device 10 includes a gate 12 that divides the unit cell into four corner regions. The gate 12 can be cross-shaped. A source of the device includes first and second source regions 16 that are located in respective opposite corner regions of the unit cell. A drain of the device includes first and second drain regions 26 that are located in respective opposite corner regions of the unit cell (those corner regions being different corner regions to the corner regions occupied by the first and second source regions 16). In this embodiment, the unit cell is again square, but it may for instance be oblong with one of the dimension of the unit cell being longer than the other.

The embodiment in FIG. 5 includes gate connection members 94 that are substantially L-shaped and further gate connection members 92 that are also substantially L-shaped in a manner similar to that described above in relation to the embodiment of FIG. 2. The gate connection members 92, 94 may be provided in separate layers of a metallisation stack located above the unit cell.

In this embodiment, the device 10 can include a drain connection member 40 that extends diagonally across the unit cell to connect to the first and second drain regions 26. The unit cell can also include a source connection member 60 that extends diagonally across the unit cell to connect to the first and second source regions 16. The drain connection member 40 and the source connection member 60 can be elongate. In this embodiment, the source connection member 60 is located in a metal level that is higher in the metallisation stack than a metal level containing drain connection member 40. The source connection member 60 and the drain connection member 40 can be provided with portions 84 and 86 for connecting to the underlying source and drain regions 16, 26. These connections can be implemented using a series of vias 96, 98 and/or intervening platforms 82, 84 similar to the arrangement described above in relation to FIG. 2. The gate connections members 92, 94 can similarly connect to the underlying gate contacts using metal filled vias 95.

In common with the embodiment described above in relation to FIG. 2, the source connection member 60 and the drain connection member 40 further includes edge connecting portions 64 and 44, respectively. The edge connecting portions 64, 44, which in the present embodiment are provided at the corners of the unit cells, can allow the source and drain members 60, 40 to be connected to the source and drain connection members of neighbouring unit cells in an array comprising a plurality of unit cells similar to that described above in relation to FIG. 3.

Note that in this example, the first and second source regions 16 and first and second drain regions 26 are not L-shaped, contrary to the example in FIG. 2. Instead, the first and second source regions 16 and first and second drain regions 26 are substantially fill each corner region 2, 4, 6, 8 of the unit cell defined by the gate 12. Comparison of FIG. 5 with the embodiment of FIG. 2 will reveal that each source region 16 and drain region 26 in FIG. 5 has more area available for contacts to be made thereto. This can assist in reducing contact resistance within the device.

Since the source regions 16 and drain regions 26 substantially fill each corner region of the unit cell, the trench isolation 74 in this embodiment has a different configuration to that described above in relation to FIG. 2. In particular, in this example the trench isolation 74 is located at a periphery of the unit cell and completely encloses a central region of each unit cell when viewed from above the unit cell. Accordingly, the trench isolation 74 in this example can completely enclose the part of the unit cell that contains the source regions 16 and drain regions 26. Note that in this example the trench isolation 74 also forms a ring that lies substantially beneath the gate connection members 92, 94. The complete enclosure of the source region 16 and drain regions 26 by the trench isolation 74 in this manner can further improve the isolation of the substrate in a device in accordance with an embodiment of this invention.

Figure 6:
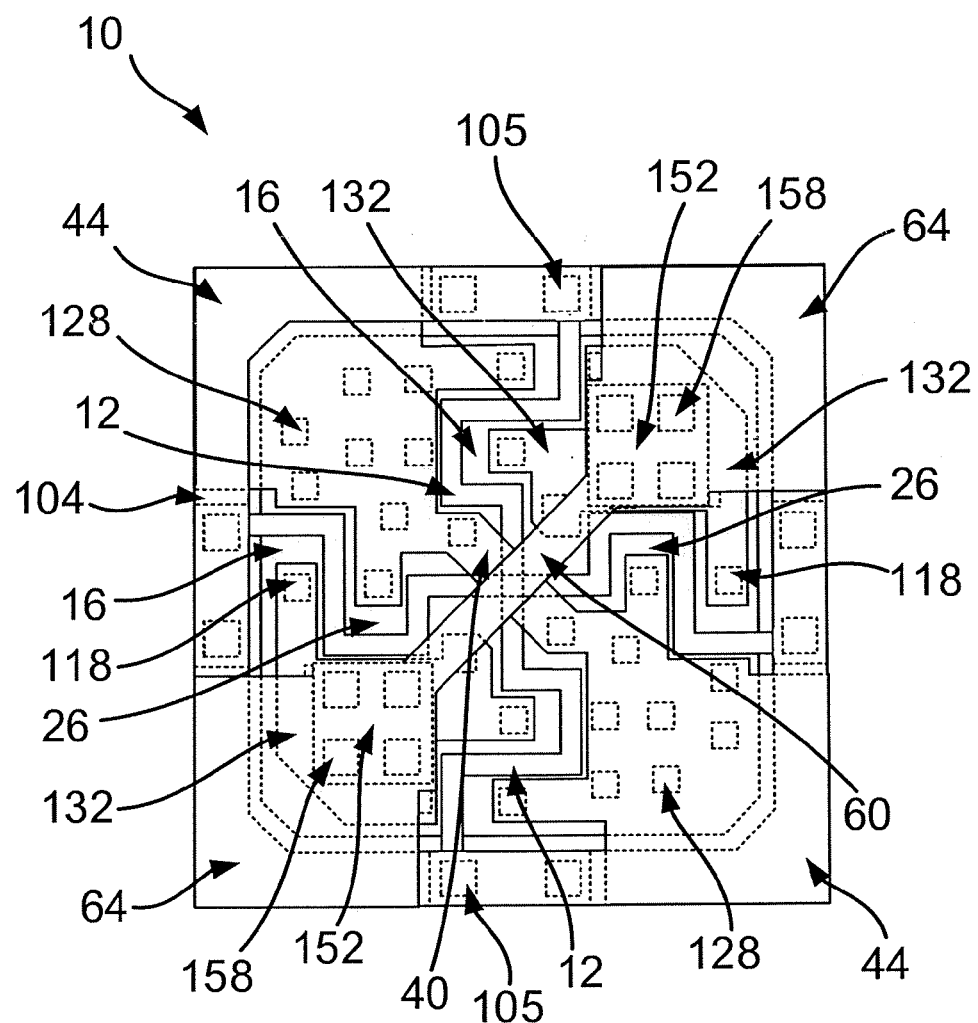
FIG. 6 shows a semiconductor device in accordance with an embodiment of the invention.

FIG. 6 shows a semiconductor device including a switch in accordance with a further embodiment of this invention. In common with the embodiment described above, the device 10 includes a gate 12 that divides the unit cell into four corner regions. A source of the device includes first and second source regions 16 that are located in respective opposite corner regions of the unit cell. A drain of the device includes first and second drain regions 26 that are located in respective opposite corner regions of the unit cell (those corner regions being different corner regions to the corner regions occupied by the first and second source regions 16). In this embodiment, the unit cell is again square, but it may for instance be oblong with one of the dimension of the unit cell being longer than the other.

In this embodiment, the gate is cross-shaped, when viewed from above a surface on which the unit cell is located. The cross shaped gate 12 includes four arms. In this embodiment, each arm of the gate takes the form of a meander pattern when viewed from above the surface on which the unit cell is located. This arrangement can increase the effective gate length for a unit cell of a given size. The first and second source regions 16 and the first and second drain regions 26 can conform to the shape of the meander pattern of the arms of the gate 12.

In common with the previously described embodiments, the unit cell shown in FIG. 6 can include a plurality of connection members, which extend over the gate, source and drain for providing electrical connections to the gate, source and drain. These connection members can be provided in a metallisation stack located above the gate 12, source and drain.

The connection members include a drain connection member 40 that extends diagonally across the unit cell to connect to the first and second drain regions 26 and a source connection member 60 that extends diagonally across the unit cell to connect to the first and second source regions 16. The drain connection member 40 and the source connection member 60 can be elongate. In this embodiment, the drain connection member 40 is located in a first metal layer of the stack. The first metal layer also includes platforms 132 for implementing connections between the first and second source regions 16 and the source connection member 60 in a manner similar to that described above in relation to the previous embodiments. The drain connection member 40 and the platforms 132 may be shaped so that the substantially overlap the layout of the underlying source and drain regions, to allow convenient connection thereto.

A second metal layer in the stack, which is located above the first metal layer, includes the gate connection member 104. In this embodiment, the gate connection member 104 is implemented in a single metal layer, unlike the embodiments described above in which the gate connection member includes portions that are provided in separate metal layers. As can be seen in FIG. 6, in this embodiment, the gate connection member 104 comprises a closed ring or loop, which connects to the underlying gate 12 through vias 105 that are located at end of each arm of the gate 12. The second metal layer can also include platforms 152 for implementing connections between the first and second source regions 16 and the source connection member 60 in a manner similar to that described above in relation to the previous embodiments. Again, the source regions 16, platforms 132, 152 and source connection member can be interconnected through vias 128, 158.

A third metal layer, located above the second metal layer, can include the source connection member 60.

The source connection member 60 and the drain connection member 40 can further includes edge connecting portions 64 and 44, respectively. The edge connecting portions 64, 44, which in the present embodiment are provided at the corners of the unit cells, can allow the source and drain members 60, 40 to be connected to the source and drain connection members of neighbouring unit cells in an array as noted above.

A device according to an embodiment of this invention can conveniently be manufactured using well established manufacturing techniques. In a first step for manufacturing a device according to an embodiment of this invention, there can be provided a semiconductor substrate such as a wafer that may be later diced into a plurality of dies. In a next step, a gate may be formed on the substrate for dividing a unit cell of the device into four corner regions of the kind described above. In a next step, a source and drain of each unit cell can be formed, each source having first and second source regions located in respective opposite corner regions of the unit cell and each drain having first and second drain regions also located in respective opposite corner regions of the unit cell. As noted above, the corner regions occupied by the source regions are not the same corner regions occupied by the drain regions of the unit cell.

After formation of the gate source and drain, metallisation techniques may be used to form a plurality of connection members of the kind described above, which extend over the gate source and drain of the unit cell for providing electrical connections thereto. It will be appreciated that the above described manufacturing method can be implemented in a manner that forms an array including a plurality of unit cells by using appropriate masks. The array can be scaled conveniently according to design requirements as noted above. After formation of the connection members, the wafer may be diced and each separate die may be individually packaged.

Figure 7:
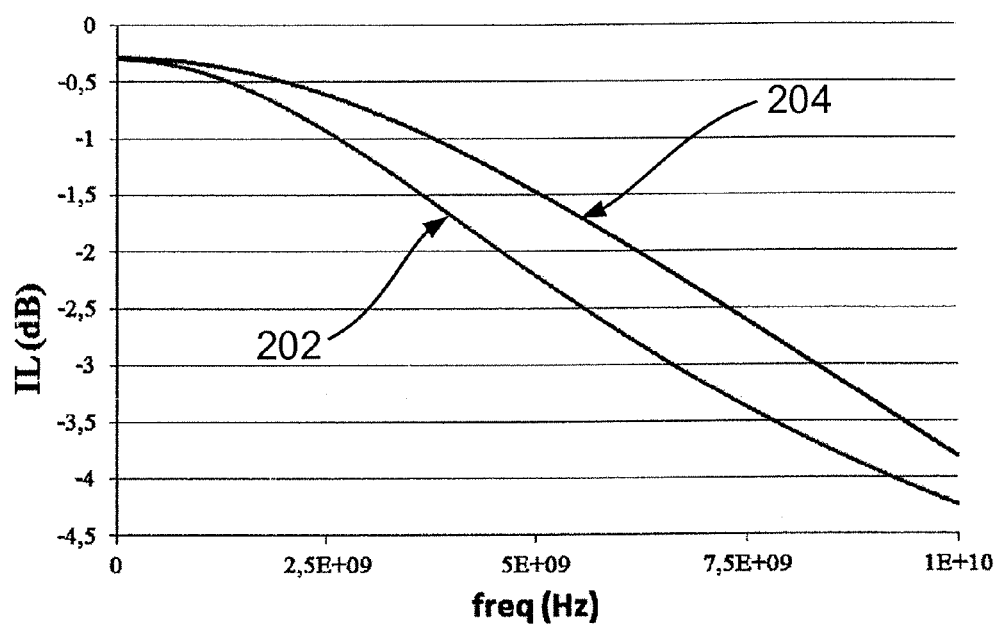
FIG. 7 compares the insertion losses of a device according to an embodiment of this invention with those of a device using the traditional multi-fingered MOS switch layout.

FIG. 7 compares the insertion losses of a device according to an embodiment of this invention with those of a device using a traditional multi-fingered MOS switch layout. These insertion losses have been simulated using two different approaches: static parasitic extraction and full wave 3D FEM (finite element method) simulations. Both simulation approaches have led to the same results.

Line 204 in FIG. 7 corresponds to a 6×5 matrix of unit cells of the kind described above in relation to FIG. 2E (i.e. including trench isolation 70). The unit cells in the array were square, with edges measuring 50 μm. The line 202 in FIG. 7 corresponds to a comb-type device having eight gate fingers each of length 37.5 μm (for an overall dimension of 300 μm). Note that the area of the two devices occupied on the substrate was the same. As can be seen in FIG. 7, a significant improvement in insertion losses was observed at both 2.4 and 5.8 GHz, which are frequencies that are used for WLAN (Wireless Local Area Network) communications. Note that these simulations do not include substrate modelling (parallel RC network). Although the substrate modelling can in principal impact on the insertion losses, given the improvements shown in FIG. 7 in the absence of substrate modelling, it is anticipated that improvements would also be present were substrate modelling to be included.

Accordingly, there has been described a semiconductor device comprising a switch and a method of making the same. The device has a layout that includes one or more rectangular unit cells. Each unit cell includes a gate that divides the unit cell into four corner regions. Each unit cell also includes a source comprising first and second source regions located in respective opposite corner regions of the unit cell. Each unit cell further includes a drain comprising first and second drain regions located in respective opposite corner regions of the unit cell. Each unit cell also includes a plurality of connection members extending over the gate, source and drain for providing electrical connections to the gate, source and drain.

Although particular embodiments of the invention have been described, it will be appreciated that many modifications/additions and/or substitutions may be made within the scope of the claimed invention.

The invention claimed is:

1. A semiconductor device comprising a switch, the device having a layout comprising one or more rectangular unit cells, each unit cell comprising:
   a gate that divides the unit cell into four corner regions;
   a source comprising first and second source regions located in respective opposite corner regions of the unit cell;
   a drain comprising first and second drain regions located in respective opposite corner regions of the unit cell, and a plurality of connection members extending over the gate, source and drain for providing electrical connections to the gate, source and drain; and further comprising a plurality of unit cells arranged in an array;

wherein nearest neighbor unit cells of the array are rotated with respect to each other by ninety degrees when viewed from above a surface on which the unit cell is located.

2. The semiconductor device claim 1, wherein each unit cell further includes trench isolation.

3. The semiconductor device of claim 2, wherein the trench isolation comprises a respective trench section located in each corner region of the unit cell.

4. The semiconductor device of claim 2, wherein the trench isolation is located at a periphery of each unit cell and completely encloses a central region of each unit cell when viewed from above a surface on which the unit cell is located.

5. The semiconductor device of claim 1, wherein each unit cell comprises at least one of:
 a source connection member that extends diagonally across the unit cell to connect to the first and second source regions; and
 a drain connection member that extends diagonally across the unit cell to connect to the first and second drain regions.

6. The semiconductor device of claim 5, wherein the source connection member and the drain connection member cross each other at a center of the unit cell when viewed from above a surface on which the unit cell is located.

7. The semiconductor device of claim 1, wherein the gate is cross-shaped, when viewed from above a surface on which the unit cell is located.

8. The semiconductor device of claim 7, wherein the gate comprises four arms, each arm comprising a meander pattern when viewed from above the surface on which the unit cell is located.

9. The semiconductor device of claim 1, wherein the connection members comprise metal features of a metallization stack located above the gate, source and drain.

10. The semiconductor device of claim 9, wherein a metallization layer containing a source connection member is separated from a metallization layer containing a drain connection member by at least one intervening metallization layer in the metallization stack.

11. The semiconductor device of claim 1, wherein the plurality of connection members of each unit cell connect to connection members of neighboring unit cells at the edges of the unit cells when viewed from above a surface on which the unit cell is located.

12. The semiconductor device of claim 11, wherein source connection members or drain connection members of each unit cell connect with source connection members or drain connection members of neighboring unit cells at the corners of the unit cells.

13. A method of making a semiconductor device comprising a switch, the method comprising
 forming at least one rectangular unit cell of the switch by:
  providing a semiconductor substrate;
  forming a gate on the substrate for dividing the unit cell into four corner regions;
  forming a source comprising first and second source regions located in respective opposite corner regions of the unit cell;
  forming a drain comprising first and second drain regions located in respective opposite corner regions of the unit cell, and
  forming a plurality of connection members extending over the gate, source and drain for providing electrical connections to the gate, source and drain; and
 forming an array of unit cells, wherein nearest neighbor unit cells of the array are rotated with respect to each other by ninety degrees when viewed from above a surface on which the unit cell is located.

* * * * *